United States Patent [19]

Ohashi et al.

[11] 4,099,421
[45] Jul. 11, 1978

[54] PUSHBUTTON TUNER

[75] Inventors: Tamaki Ohashi; Shigemasa Shosakai; Shohei Yamagishi; Kunihiro Taniguchi, all of Tokyo, Japan

[73] Assignee: Nihon Technical Kabushiki Kaisha, Japan

[21] Appl. No.: 673,119

[22] Filed: Apr. 2, 1976

[30] Foreign Application Priority Data

Apr. 5, 1975 [JP] Japan .................................. 50/40811

[51] Int. Cl.² ............................................. F10H 35/18
[52] U.S. Cl. .................................. 74/10.33; 74/10.37
[58] Field of Search ................. 74/10.33, 10.31, 10.27, 74/10.35, 10.37, 10 R; 334/7

[56] References Cited

U.S. PATENT DOCUMENTS

| 2,863,043 | 12/1958 | Schmidt et al. | 74/10.33 |
|---|---|---|---|
| 3,714,835 | 2/1973 | Fiore | 74/10.33 |
| 3,863,509 | 2/1975 | Zimatok | 74/10.33 |
| 3,946,344 | 3/1976 | Wilkinson | 74/10.37 |

Primary Examiner—Benjamin W. Wyche
Assistant Examiner—R. C. Turner
Attorney, Agent, or Firm—Robert E. Burns; Emmanuel J. Lobato; Bruce L. Adams

[57] ABSTRACT

A pushbutton tuner has a plurality of presettable pushbutton actuator assemblies. Each of the pushbutton actuator assemblies comprises a slide mounted on a support so as to be movable between a forward inoperative position and a rearward operative position and normally biased into the inoperative position, a control member pivotally mounted on the slide and having an upstanding pin mounted thereon and being adjustable positionable relative to the slide, a preset member for releasably locking the control member to the slide, and a pushbutton carried by the preset member and having a forward end of the slide slidably received therein. The pushbutton actuator assemblies are disposed in a direction transverse to a movable part of a tuning element. The movable part of the tuning element is formed by a flat plate having formed therein a plurality of V-shaped notched cam edges, one each associated with the respective pushbutton actuator assemblies, and in each of which the upstanding pin of the control member is located, so that movement of a particular pushbutton actuator assembly to its operative position causes the movable plate to be adjusted to a position corresponding to a particular frequency which is determined by the positioned control member. The pushbutton tuner is provided with a clutch trip means including a shift member which extends substantially parallel to the movable plate and mounted on the support so as to be movable in the lengthwise direction thereof, the shift member having a plurality of cams each associated with one of the pushbutton actuator assemblies. A movement of a particular pushbutton actuator assembly causes the drive member to move axially thereof as the pushbutton is moved, thereby driving the shift member to trip the clutch assembly.

10 Claims, 16 Drawing Figures

PUSHBUTTON TUNER

FIELD AND BACKGROUND OF THE INVENTION

The invention relates to a pushbutton tuner, and more particularly, to a pushbutton tuner having a small assembled size suitable for containment in an enclosure of a limited size, in conjunction with an eight- or four-track tape player.

Efforts have been made to install an audio instrument including both a pushbutton tuner and an eight- or four-track tape player in a limited space such as a standard dashboard box of an automobile which is often utilized for the provision of a car radio set. Such an audio instrument is economically advantageous in that the principal electrical circuit is shared by both the tuner and the player, and also facilitates the operation thereof by a user. However, such effects have not achieved a satisfactory success as yet because of the failure to reduce its size sufficiently to permit its accommodation in a space comparable to the conventional car radio set. As is recognized, an eight- or four-track tape cartridge is standardized in size, so that the associated tape player must be provided with a housing of a predetermined size. If it is installed in a space such as an automobile dashboard box in which a car radio set is normally provided, it occupies a large proportion of the space, with the vertical height thereof reaching substantially one-half that of the dashboard space. The tape player essentially comprises a tape drive which requires a substantial vertical dimension for its provision. In particular, a flywheel which is used to drive a tape capstan is disposed for rotation in a plane which is located above the cartridge housing, thus adding the overall height of the tape player. It will be evident, therefore, that if such a player is disposed in overlying relationship with a conventional pushbutton tuner, the resulting assembly will be too large to be contained in a standard dashboard box.

A conventional pushbutton tuner includes a plurality of manually operated slides, which are formed as flat plates having their major surface disposed in a vertical orientation. Each slides is movable between its inoperative and operative positions independently from each other, and when one of the slides is moved to its operative position, a control member carried thereby is effective to locate a movable part of a tuning element to a predetermined position corresponding to a desired signal frequency to be received. In order to enable tuning to a particular frequency, the control member includes a cam plate which may be positioned relative to the associated slide in a manner corresponding to the desired frequency. The cam plate is normally locked and maintains this position unless it is unlocked. The tuning element includes a rockable arm carrying a pair of parallel rods which are selectively engaged by the cam plates associated with the individual slides, and which are moved by a selected cam plate to cause the arm to operate to a telescoped armature in a tuning coil. The rockable arm can also be adjusted to a position corresponding to a desired reception frequency by a rotatable knob which is manually operated through a clutch. In this instance, when a selected cam plate is unlocked and engaged with the pair of rods, this cam plate can be positioned on the associated slide so as to correspond to the desired frequency. When positioning the cam plate in this manner, the clutch is maintained to continue the operative connection between the clutch is maintained to continue the operative connection between the rotatable knob and the rockable arm, serving to lock the latter in order to avoid any unintended movement of the pair of rods as they are engaged by the selected cam plate. In this manner, a precise positioning of the cam plate is assured which permits a subsequent tuning to the desired frequency. During normal use, when a pushbutton is operated to move one of the slides to its operative position, the clutch is disengaged before the slide reaches its operative position, releasing the rockable arm operatively connected with the driven clutch shaft for free movement. A release member for the clutch comprises a comb-shaped swingable arm which is disposed across the array of slides, and as it is moved together with a slide, it operates a trip lever.

Conventional pushbutton tuners have the disadvantage of requiring an increased vertical dimension even though a substantial wasted internal space is left between adjacent slides. This is due to the arrangement employed in which the individual slides are disposed in vertical orientation and the tuning element or the pair of rods are disposed across the array of slides on the opposite sides thereof. In order to permit an independent operation of pushbuttons which are arranged in juxtaposition, each pushbutton must be spaced from adjacent one or ones by a minimum spacing which is primarily determined by the finger size. It represents an obvious loss of the available space which is at premium not to utilize the unused spaces between the pushbuttons but to dispose the slides in a manner to increase the height. If such loss can be eliminated, there can be obtained a pushbutton tuner of a reduced size without compromising the mechanical strength which would otherwise result from a reduction in the size of mechanical components used.

To allow a horizontal orientation of the slides, there must be provided an alternate tuning element which is substituted for the usual rockable arm which is selectively engaged by cams carried by the individual slides. One proposal has been made previously by one of the present inventors to resolve this problem. Essentially, the proposal comprises the provision of a movable plate which is disposed across the array of slides and which is formed with a plurality of apertures of an isosceles triangle form, one each associated with individual slides which are arranged in horizontal orientation and in juxtaposition. Each aperture engages an upstanding pin secured to a control plate on the associated slide, and when a selected slide is moved to its operative position, the pin shifts the movable plate to a predetermined position. The proposal failed to bring forth a practical implementation, however, because of the difficulty in positioning a control member carried by a selected slide so as to adjust a particular pushbutton to a particular frequency, though a novel tuning element has been proposed. When positioning the control member, the tuning element is locked against movement, and this caused a difficulty in operatively connecting the tuning element with a rotatable knob and controlling the clutch to release the operative connection when a slide is operated. Specifically, no space was available in the proposed construction to install a conventional trip member, and additionally, the use of such trip member resulted in immediately releasing the clutch when depressing the pushbutton from its reset position. However, this prior proposal conceived the possibility to construct a pushbutton tuner of a substantially reduced vertical assembled size since a single movable plate is disposed across the slides which are in horizontal orientation. The invention, therefore, provides a practical implementation of the prior proposal mentioned above.

OBJECT AND SUMMARY OF THE INVENTION

It is a general object of the invention to provide a pushbutton tuner of a reduced size.

It is another object of the invention to provide a pushbutton tuner having a placement of component parts which is preferred for assembly together with an eight- or four-track tape player.

It is a further object of the invention to provide a pushbutton tuner having a simple and construction.

It is a specific object of the invention to provide a practicable pushbutton tuner having a plurality of slides which are disposed in horizontal orientation and in juxtaposition with each other.

In accordance with the invention, each slide carries a control plate thereon which is provided with an upstanding pin, which is in turn located with one of recesses or apertures formed in a movable plate disposed across the array of slides, the recesses being associated one each with the individual slides. The recess or aperture defines a V-shaped cam edge. When a selected slide is moved to its operative position, the pin thereon engages the cam edge of the corresponding recess and moves toward the apex of the cam edge, whereby the movable plate shifts to a predetermined position corresponding to a desired frequency to be received. The control plate can be adjusted in either position or orientation to adjust a particular slide to a particular tuning frequency, but is normally locked by a locking member. The locking member comprises a plate fixing lever mounted on the slide, and a preset plate having a wedge portion at one end which functions to engage the fixing lever with the control plate. The preset plate is slidably mounted on the slide and is provided with a pushbutton at its other end. This end of the slide also engages the pushbutton, but when the pushbutton is pulled forwardly to a reset position, only the preset plate is allowed to move, thereby disengaging the wedge portion from the fixing lever and unlocking the control plate.

The movable plate can also be adjusted to a position corresponding to a desired reception frequency by a manually rotatable knob which acts through a clutch. When the movable plate assumes an adjusted position, the depression of a pushbutton associated with a slide which carries the unlocked control plate causes a movement of the slide together with the pushbutton, whereby the control plate is positioned by means of the upstanding pin which is located in accordance with the cam edge of the corresponding recess or aperture. A further depression of the pushbutton after the slide has reached its operative position causes the preset plate to move over the slide, thereby locking the control plate again.

In this manner, each of the control plates on a series of slides is positioned so as to achieve a tuning with a particular frequency. In accordance with the invention, the movable plate is temporarily secured in position during such positioning process of the control plate in order to assure a predetermined position of the movable plate. As mentioned previously, the movable plate is connected with a driven shaft of the clutch. During operation of the clutch, rotation is not transmitted from the driven shaft to the driving shaft and the driven shaft is constrained. In accordance with the invention, there is provided a shift plate which is adapted to move in a direction parallel to the movable plate, and which functions to release the clutch after the positioning of the control plates is substantially completed. As a result, the problem associated with a possible movement of the movable plate during the positioning of the control plates with consequent improper adjustment to unintended frequencies is avoided. The shift plate functions, during a normal pushbutton operation, to release the clutch before the slide reaches its operative position. The shift plate is provided with cams, one each for the respective pushbuttons, each of which serves to engage a drive bar which moves with the pushbutton to thereby drive the shift plate as a selected pushbutton is depressed from its inoperative toward its operative position. However, when the pushbutton is depressed from the reset position which is opposite from the operative position, it cannot engage the drive bar until the pushbutton reaches a preset position, that is, the normal inoperative position, thus allowing the control plate to be accurately positioned in the meantime.

DESCRIPTION OF PREFERRED EMBODIMENT

In the description to follow, the pushbutton tuner according to the invention is integrally assembled with a tape player, but it should be understood that this in no way limits the application of the invention.

Figure 1:
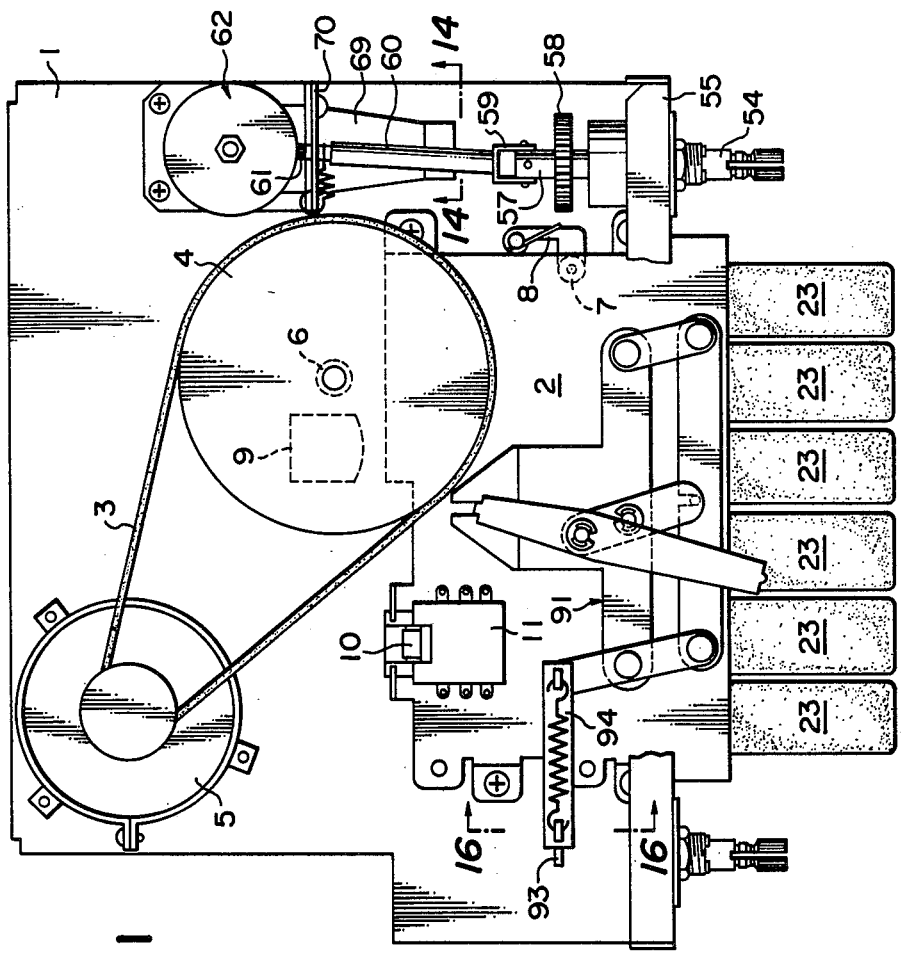
FIG. 1 is a plan view of the pushbutton tuner in accordance with the invention as assembled together with a tape player.
Figure 3:
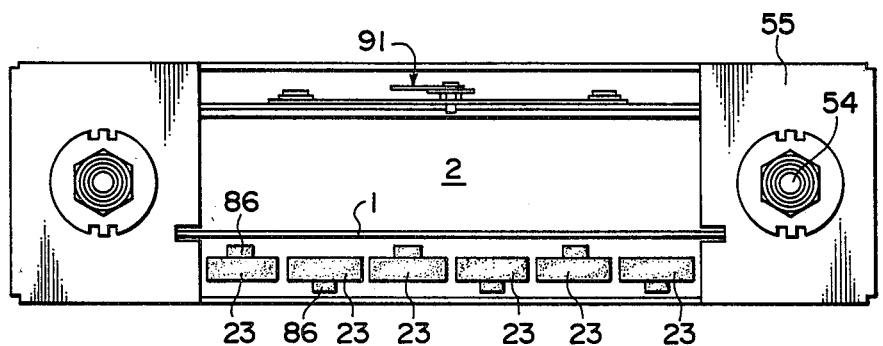
FIG. 3 is a front view thereof.

Referring to FIGS. 1 and 3, the instrument shown includes a base plate 1 above which the principal components of a tape player are disposed and below which the principal components of a pushbutton tuner are disposed. While a variety of arrangements are known for the tape player, it is generally provided with a housing 2 which receives an eight- or four-track tape cartridge. The player is shown as including a drive belt 3 extending around a flywheel 4 and the shaft of an electric motor 5, the flywheel driving a capstan 6 in turn. As a tape cartridge is inserted into the housing 2, it slides over the base plate 1 and comes to a stop at a position at which its lateral engaging portion engages a retaining roller 7 supported by a resilient blade 8. At this position, the tape contained within the cartridge comes into contact with a playback head 9 mounted on the base plate 1. As the cartridge reaches its operative position, it operates a change-over switch 11 having an actuator piece 10 which projects into the housing 2, thus changing the connection of the electrical circuit of the instrument from the tuner position to the player position. The player is also provided with various known elements which are used to switch the track or tracks from which a playback operation is desired, but these elements will not be described herein.

Figure 2:
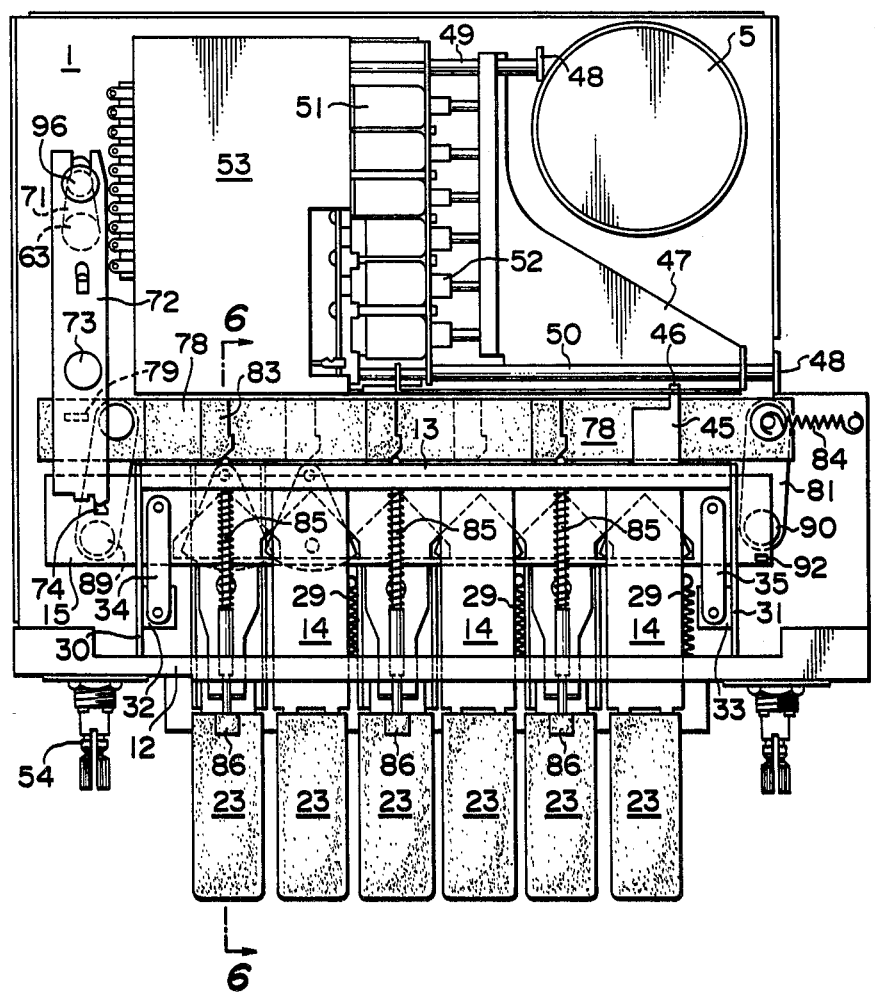
FIG. 2 is a bottom view of the pushbutton tuner shown in FIG. 1.

FIG. 2 shows the pushbutton tuner of the invention more clearly. The tuner includes a plurality of flat slides 14 which are disposed substantially in parallel relationship and which extend through a pair of walls 12, 13 extending from the base plate 1. Each slide 14 is received in a channel defined between the walls 12, 13 so as to be independently movable from a forward inoperative position, as shown, to a rearward operative position. However, the slides are normally maintained in their inoperative position by springs 29. The term "forward" as used herein refers to a position nearer the operator or the downward direction as viewed in FIG. 2, and the term "rearward" refers to the opposite or upward direction as viewed in the same Figure. For the reason to be described later, the slides 14 are alternately disposed on the opposite sides of a movable plate 15 which extends to traverse the array of slides. In addition, the orientation of adjacent slides varies by 180°. In other words, the alternate slides are reversed. However, all of the slides are disposed in horizontal orientation.

Figure 5:
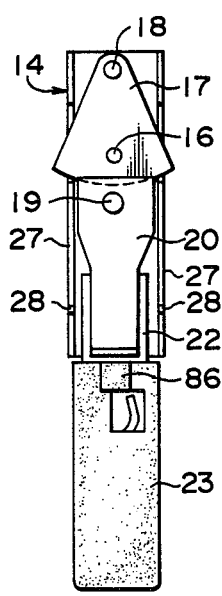
FIG. 5 is a plan view of the pushbutton slide assembly shown in FIG. 2.

Referring to FIG. 5, a control plate 17 having an upstanding pin 16 thereon is pivotally mounted at 18 on the slide 14. The control plate 17 can be adjusted in its relative position with respect to the slide 14 about the pivot 18, but is locked by a plate fixing lever 20 which is mounted on a stationary pin 19 on the slide 14. The alternate disposition of the adjacent slides on the opposite sides of the movable plate 15 prevents an interference between the adjacent control plates 17 which might otherwise occur as a result of an angular positioning adjustment of one control plate about the pivot 18 to cause it to project laterally beyond the slide 14.

Figure 6:
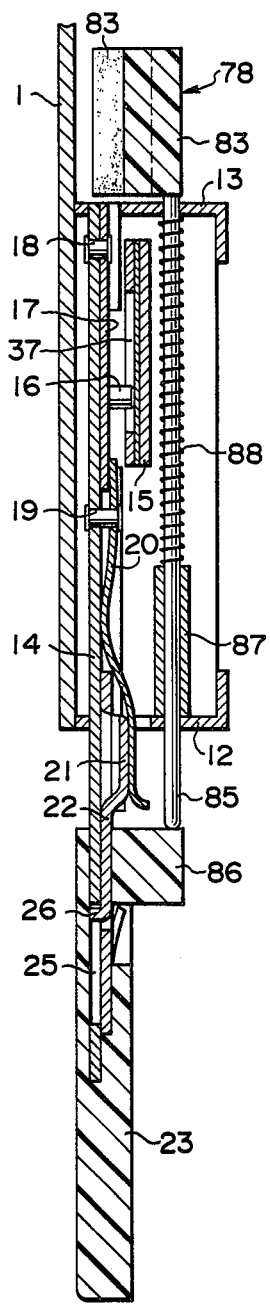
FIG. 6 is a cross section taken along the line 6—6 shown in FIG. 2.
Figure 7:
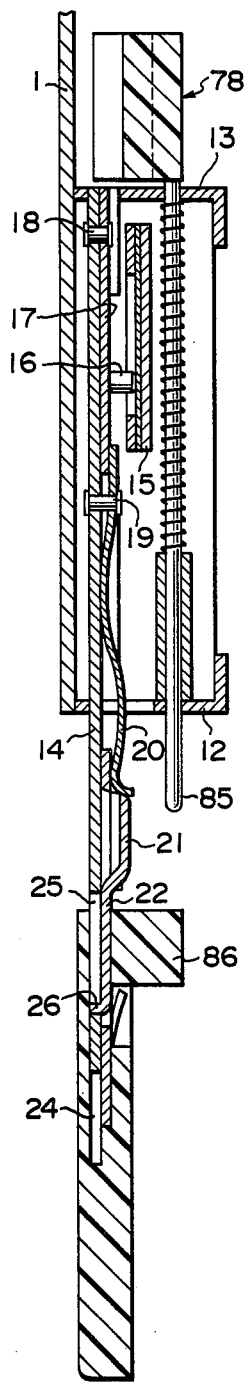
FIG. 7 is a similar cross section to FIG. 6 but in which the preset member assures a different operational position.

Referring to FIG. 6 in combination with FIG. 5, a preset plate 22 is slidably mounted on the slide 14 and has at its one end formed with a wedge portion 21 which functions to cause the fixing lever 20 to engage with the control plate 17. A pushbutton 23 is secured to the other end of the preset plate 22, and is formed with a bore 24 (see FIG. 7) into which the end of the slide 14 is slidably inserted. Toward this end, the slide 14 is provided with a notch 25, into which extends a punched tab 26 of the preset plate 22. The slide 14 may comprise a generally flat plate, which however may be provided with a pair of sidewalls 27 of a small height along its opposite sides in order to increase its mechanical strength. The slide 14 is additionally provided with a pair of projections 28 (see FIG. 5) which abut against the front wall 12 to prevent a further movement of the slide forwardly beyond its inoperative position. Consequently, when the pushbutton 23 is pulled forwardly from its inoperative position shown in FIG. 6, only the preset plate 22 is allowed to move, thereby disengaging the wedge portion 21 thereof from the plate fixing lever 20 and achieving a reset position in which the control plate 17 is unlocked.

Figure 11:
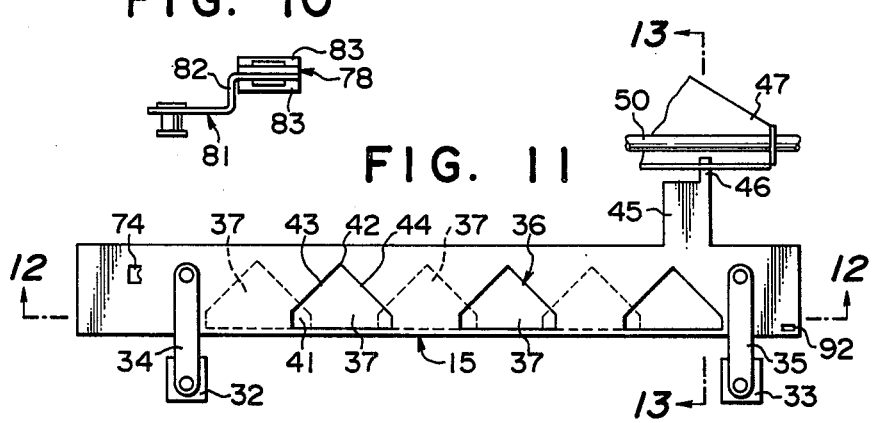
FIG. 11 is a fragmentary detailed view of the movable plate shown in FIG. 2.
Figure 12:
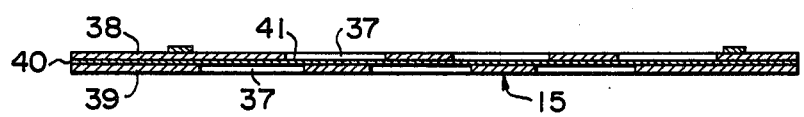
FIG. 12 is a cross-section taken along the line 12—12 shown in FIG. 11.
Figure 13:
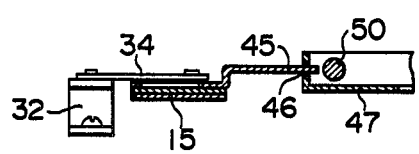
FIG. 13 is a cross section taken along the line 13—13 shown in FIG. 11.

FIGS. 11 to 13 show the movable plate 15 in detail. As will be noted in FIG. 2, the movable plate 15 is disposed so as to traverse across the array of slides, and its both ends slidably received in notches formed in a pair of sidewalls 30, 31 which are secured to the base plate 1. Additionally, the movable plate 15 is also supported by a pair of parallel, swingable links 34, 35 which extend between the respective ends of the plate 15 and mounts 32, 33 which are provided on the sidewalls 30, 31. The movable plate 15 is formed with a plurality of recesses 37, one each associated with the respective slide, each of which define a V-shaped cam edge 36 of a same configuration. Since alternate slides are disposed on the opposite sides of the movable plate 15, immediately adjacent recesses 37 are formed in the opposite surfaces thereof. Such a movable plate can be most simply manufactured by forming a first plate 38 apertured to provide the recesses 37 in the upper surface of the movable plate and a second plate 39 apertured to provide the recesses in the lower surface, and by securing or bonding them together with a third, solid plate 40 sandwiched therebetween, as illustrated in FIG. 12. It should be understood, however, that this is illustrative only. Alternatively, the movable plate 15 may be molded from synthetic resin material. While the movable plate 15 shown has an overlapping portion 41, the latter may be formed as a window. In this instance, the intermediate, third plate 40 may be eliminated.

Located within the recess 37 of the movable plate 15 is an upstanding pin 16 on the control plate 17 associated with the slide 14. As an associated slide 14 is moved to its operative position, the upstanding pin 16 moves toward an apex 42 of the recess 37 in which it is located. When the pin 16 engages the cam edge 36 of the recess 37, it causes the movable plate 15 to move in the longitudinal direction thereof. This movement of the movable plate 15 is smoothly guided by the swingable links 34, 35. In this manner, the movable plate 15 is controlled to assume a predetermined position corresponding to a frequency which is desired to be received. Various modes of operation are possible as illustrated in FIGS. 15a to 15e, which will be considered below.

Figure 15A:
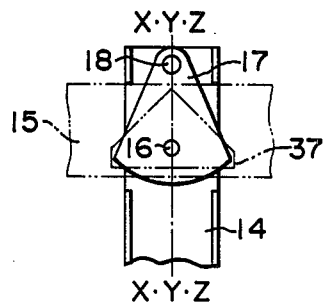
FIGS. 15a to 15e are plan views illustrating different operational positions of the control plate.
Figure 15B:
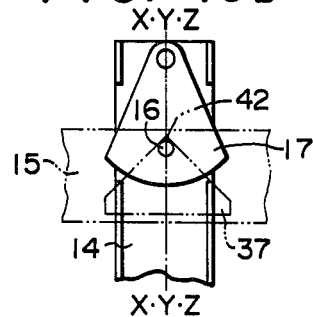
Figure 15C:
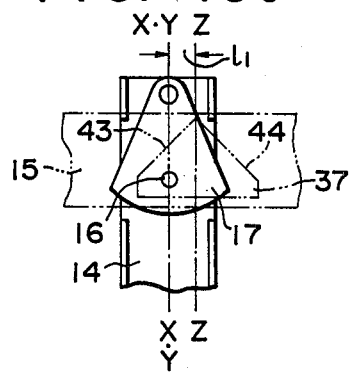

A line joining the pivot 18 for the control plate 17 and the pin 16 is designated by X—X while the axis of movement along which the slide 14 moves is designated by Y—Y. Initially considering the situation in which the line X—X coincides with the axis Y—Y, this is possible in two instances. Specifically, in the inoperative position of the slide 14, the pin 16 may lie (in FIG. 15a) or may not lie (in FIG. 15c) on a line Z—Z passing through the apex 42 of the recess 37 and extending parallel to the axis Y—Y. In each of these instances, when the slide 14 is moved to its operative position, the pin 16 will be located relative to the recess 37 as shown in FIG. 15b. During movement from the position of FIG. 15a to that of FIG. 15b, the pin 16 engages neither first nor second cam portions 43, 44 of the cam edge 36, so that the movable plate 15 remains stationary, while during movement from FIG. 15c to FIG. 15b, the pin 16 engages the first cam portion 43 of the recess 37 to shift the movable plate 15 by a distance $l_1$ to the left. It will be readily understood that when the line Z—Z is on the left-hand side of the pin 16 in the inoperative position of the slide 14, the movable plate 15 will be shifted to the right.

Figure 15D:
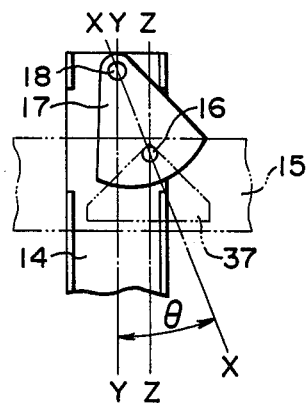
Figure 15E:
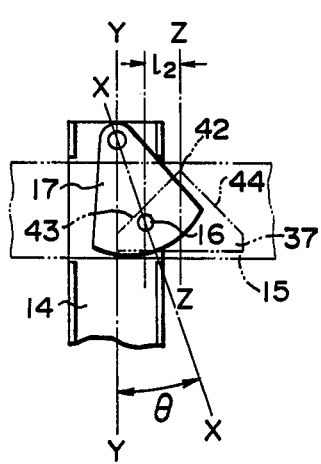

When the line X—X forms an offset angle θ with the axis Y—Y, the pin 16 may lie (not shown) or may not lie (in FIG. 15e) on the line Z—Z in the inoperative position of the slide 14. In either instance, when the slide 14 is moved to its operative position, the pin 16 will be located relative to the recess 37 as shown in FIG. 15d. In the first instance, the movable plate 15 remains stationary while in the second instance, the movable plate 15 will be shifted by a distance $l_2$ to the left, generally as mentioned before.

The movable plate 15 is provided with a rearwardly extending tuning arm 45, the end 46 of which is connected with an armature support 47. As will be noted from FIG. 2, the armature support 47 is displaceable on a pair of shafts 49, 50 which are in turn supported by bearings 48 secured to the base plate 1, and carries a plurality of armatures 52, one each telescoped into tuning coils 51. The tuning coils 51 are electrically connected with a radio receiver unit 53 which is located adjacent thereto. Thus, a selected pushbutton 23 may be operated to move the associated slide 14 to its operative position, whereupon the upstanding pin 16 on the particular control plate 17 which is carried by the selected slide 14 controls the movable plate 15 to a predetermined position, thereby enabling the receiver unit 53 to be tuned to the corresponding frequency.

Figure 4:
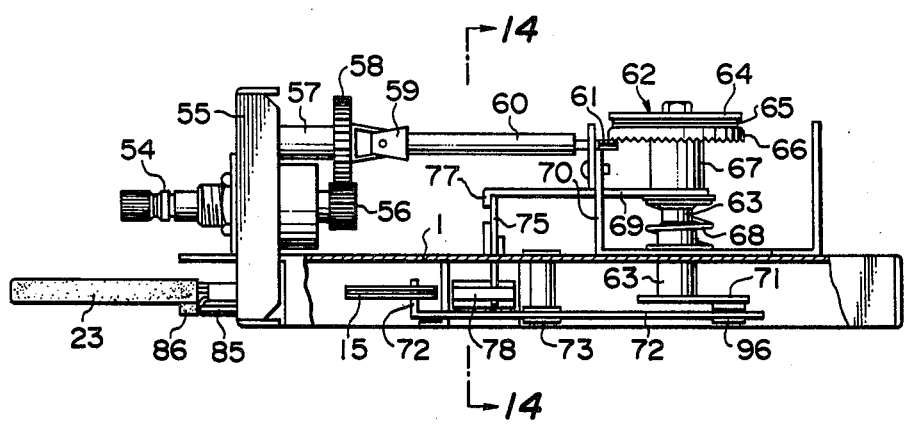
FIG. 4 is an end view as viewed from the right-hand side of FIG. 1.

The movable plate 15 may also be controlled to a position corresponding to a desired reception frequency by a manually rotatable shaft 54 which acts through a clutch assembly 62. This adjusting mechanism is shown primarily in FIGS. 2 and 4. The knob shaft 54 is rotatably mounted in a front panel 55 which is secured to the base plate 1, and is provided with a gear 56 on its terminal end, which meshes with a gear 58 on a rotary shaft 57 which is in turn rotatably mounted in the front panel 55. Thus the knob 54 can be used to drive the shaft 57. Connected with the rotary shaft 57 through a universal joint 59 is one end of a transmission shaft 60, the other end of which is supported by a support plate 70 and carries a pinion 61 for connection with the clutch assembly 62. The clutch assembly 62 shown is known in itself and therefore will not be described in detail. However, it should be noted that its spindle 63 is located above the base plate 1 and oriented vertically in distinction to the conventional arrangement. The clutch assembly 62 comprises a clutch member 64 secured to one end of the spindle 63, a sleeve 67 having a crown gear 66 which includes another clutch member 65 located opposite to the clutch member 64, a spring 68 urging the clutch member 65 into contact with the clutch member 64, and a clutch lever 69 for moving the clutch member 65 away from the clutch member 64 against the resilience of the spring 68. The crown gear 66 is in meshing engagement with the pinion 61, and in normal condition, the spindle 63 is driven by rotation of the pinion 61. The spindle 63 is rotatably mounted in the base plate 1 and has its other end extending below the latter. Secured to this end of the spindle 63 is one end of a first arm 71, the other end of which is operatively connected with one end of a second arm 72 through a pin 96. The second arm 72 is rotatably mounted on a stud 73 which is fixedly mounted on the base plate 1, and has its other end operatively connected with an opening 74 formed in the movable plate 15. Consequently, as the spindle 63 rotates, the first arm 71 connected with its lower end moves angularly, whereby the second arm 72 rotates about the stud 73 to move the movable plate 15 in the lengthwise direction thereof. It should be noted that though the movement of the plate 15 is rectilinear in a direction tangentially of the circle depicted by the movement of the adjacent end of the arm 72 which is arcuate so that an operational interference may result, there is provided a suitable known arrangement which permits a lost motion of the arm in a direction perpendicular to the length of the plate 15 but which assures an accurate transmission of movement in the lengthwise direction of the plate 15. In this manner, the movable plate 15 can be controlled or adjusted to a position corresponding to a desired reception frequency.

To enable a particular pushbutton 23 to be utilized for the tuning to a particular frequency, the control plate 17 is positioned relative to the slide 14. The positioning is started with pulling the pushbutton 23 forwardly from the inoperative position shown in FIG. 6 to the reset position shown in FIG. 7, thus disengaging the wedge portion 21 of the preset plate 22 secured thereto from the fixing lever 20 to thereby unlock the control plate 17. After the movable plate 15 is controlled to an adjusted position, the pushbutton 23 is depressed from the reset position toward the operative position, whereupon the slide 14 is moved to its operative position, and the free control plate 17 carried thereby has its upstanding pin 16 allowed to move to the apex 42 of the corresponding recess 37 of the movable plate 15. The manner of this operation will be clearly understood by reference to FIGS. 15a to 15e. In the reset position of the pushbutton 23, the slide 14 assumes its preset or inoperative position. Here, it is to be noted that in the embodiment shown, the travel between the inoperative and the operative position of the pushbutton is approximately equal to the travel between the inoperative and the reset position of the pushbutton. When the pushbutton is depressed, the slide 14 initially is driven to its operative position. This is achieved by the abutment of the inner end of wedge portion 21 of the preset plate 22 against the curved end of the fixing lever 22. The pushbutton 23 still assumes the preset position or the inoperative position which it normally assumes when the slide 14 has reached its operative position, so that a continued depression of the pushbutton results in the preset plate 22 sliding on the slide to lock the control plate 17 again. Subsequently the control plate 17 maintains the adjusted position, with consequent assurance that the movable plate 15 will be controlled to whatever position which is thus established.

Figure 8:
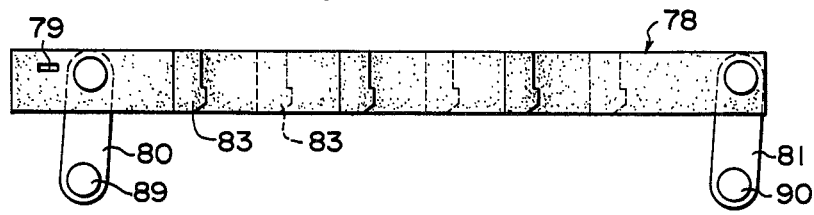
FIG. 8 is a plan view of the shift plate shown in FIG. 2.
Figure 9:
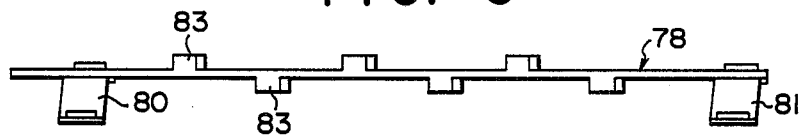
FIG. 9 is a front view of the shift plate shown in FIG. 8.
Figure 10:
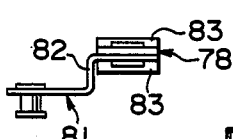
FIG. 10 is an end view as viewed from the right-hand side of FIG. 8.
Figure 14:
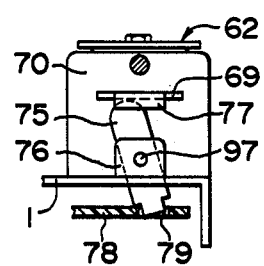
FIG. 14 is a cross section of the clutch trip member, as taken along the line 14—14 shown in FIG. 1.

In the normal operation of the pushbutton 23, the clutch assembly 62 functions to disengage the operative connection between the movable plate 15 and the rotatable knob 54. This takes place through the clutch trip lever 69. The lever 69 is received in a notch formed in the support plate 70 and is operable to move one end thereof, which engages the sleeve 67, about the pivot formed by the engagement with the notch in response to a force applied to the other end 77 thereof. As will be seen in FIG. 14, the other end 77 of the trip lever 69 is operatively connected with one end of a relay lever 75, which is pivotally mounted by a pin 97 on a mounting plate 76 secured to the base plate 1 approximately at a midway point along its length, with its other end being operatively connected with an opening 79 formed in a shift plate 78. The shift plate 78 is shown in detail in FIGS. 8 to 10, and is disposed substantially parallel to and in the same plane as the movable plate 15, as will be noted in FIG. 2. The shift plate 78 is supported by a pair of parallel swingable links 80, 81 which are pivotally connected with the base plate 1 at their one ends 89, 90. These links are formed with a step 82 in it so as to permit the shift plate 78 to move in a given plane. The shift plate 78 is formed with a plurality of raised cams 83, all of a similar configuration and one each associated with the respective slides 14. Because the alternate slides 14 are disposed on the opposite sides of the movable plate 15, the alternate raised cams 83 are similarly located on the opposite surfaces of the shift plate 78. Such shift plate 78 may be readily molded from synthetic resin material. Normally the shift plate 78 is biased toward the right, as viewed in FIG. 2, by a spring 84 in order to hold the clutch trip lever 69 in its inoperative position. There are provided a plurality of drive bars 85 which are associated with the respective raised cams 83 on the shift plate 78 for moving the latter against the resilience of the spring 84. Each drive bar 85 is disposed in the same direction as the slide 14 and on the opposite side of the movable plate 15 from the slide. As with the slide, the drive bar is slidably received in openings formed in the pair of walls 12, 13, with its one end bearing against the raised cam 83 and its other end located opposite to the rear surface of a projection 86 formed on the pushbutton 23. A spring 88 is disposed on the drive bar 85 intermediate the rear wall 13 and a portion 87 thereof which has an increased diameter. Normally, the drive bar 85 is resiliently biased so that said other end thereof just bears against the rear surface of the projection 86 in the inoperative position of the pushbutton 23. Consequently, when a particular pushbutton 23 is depressed from its inoperative toward its operative position, the associated drive bar 85 will be displaced axially, whereby said one end thereof urges against the raised cam 83 to move the shift plate 78 in a direction opposite from the direction of resilience of the spring 84. This movement takes place smoothly under the assistance of the parallel links 89, 90, without requiring much effort on the part of an operator. In this manner, the clutch trip lever 69 can be operated before any slide 14 which corresponds to the particular pushbutton 23 reaches its operative position, whereby the upstanding pin 16 on the control plate 17 carried by that slide 14 is capable of controlling the freed movable plate 15 to a predetermined position. On the other hand, when the pushbutton 23 is moved from the reset position (FIG. 7) toward the preset position, the drive bar 85 remains in its original position until this pushbutton reaches the preset position, thereby preventing said one end thereof from engaging the raised cam 83. As a consequence, the clutch assembly 62 maintains the operative connection between the movable plate 15 and the rotatable knob 54, constraining the plate 15. When the pushbutton 23 moves from the reset position and reaches the preset position, the pin 16 on the control plate 17 carried by the slide 14 corresponding to this pushbutton moves into the apex 42 of the corresponding recess 37 of the movable plate 15 which now assumes an adjusted position. Since the movable plate 15 is locked at this time, the control plate 17 can be positioned accurately. A further depression of the pushbutton 23 beyond the preset position causes its projection 86 to move the drive bar 85 axially thereof, achieving a similar operation as before. At the same time with or prior to this operation, the preset plate 22 secured to the pushbutton 23 slides over the slide 14 to hold the control plate 17 in position. In other words, the release of the clutch assembly 62 and the locking of the control plate 17 proceed concurrently, making the movable plate 15 to be freely movable while constraining the control plate 17 against movement. These two operations may be terminated simultaneously or either operation may be terminated earlier than the other.

Figure 16:
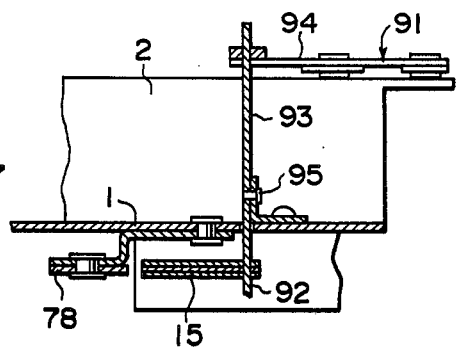
FIG. 16 is a schematic illustration, partly in section, of a pointer member, as taken along the line 16—16 shown in FIG. 1.

The value of the tuning frequency corresponding to the position of the movable plate 15 is displayed by a pointer member 91 including a parallelogram linkage of a known construction. As will be noted in FIG. 16, the pointer member 91 is connected through a link 94 with one end of a lever 93, the other end of which engages an opening 92 formed in the movable plate 15. The lever 93 is pivotally mounted on a support plate 95 secured to the base plate 1.

As discussed above, in the pushbutton tuner according to the invention, a pushbutton actuator assembly for the tuning element can be disposed in horizontal orientation, and movable parts of the tuning element which move in response to the actuator assembly can be formed as thin plates. Finally, the shift means which release the connection of the clutch assembly in order to premit a manual adjustment or setting of these movable parts may be disposed generally in the same plane as the plate-shaped movable parts. As a result, the pushbutton tuner can be assembled in a very small vertical dimension, which may be as small as within one centimeter. It is a feature of the invention that since such a drastic reduction in the vertical thickness can be achieved without requiring a reduction in the size of various components and parts, the tuner retains a high mechanical strength, presenting a high resistance to rough handling and substantially eliminating a tuning error which is usually caused by a deformation such as flexure of parts.

It should be understood that the above description is illustrative only, but not limitative, of the invention and that the scope of the invention is solely limited by the appended claims.

What is claimed is:

1. In a pushbutton tuner having a support; a tuning element mounted on the support to establish a tuning frequency and including a movable part which is movable to a position corresponding to a desired tuning frequency; a manually rotatable actuator assembly for selectively adjusting the tuning element to a position corresponding to the desired tuning frequency; a clutch assembly for normally operatively connecting the manually rotatable actuator assembly with the tuning element; a plurality of presettable pushbutton actuator assemblies each operable to selectively adjust the tuning element to a position corresponding to a particular tuning frequency that is different from the tuning frequency established by any of the remaining pushbuttons; and clutch trip means for releasing the connection between the manually rotatable actuator assembly and the tuning element in response to operation of any one of the pushbutton actuator assemblies: the improvement wherein each of the pushbutton actuator assemblies comprises a slide mounted on the support so as to be slidably movable between a forward inoperative position and a rearward operative position and normally biased into the inoperative position, a control member pivotally mounted on the slide and being adjustably positionable relative thereto and having an upstanding pin mounted thereon, a preset member for releasably locking the control member to the slide, and a pushbutton carried by the preset member and having a forward end of the slide slidably received therein; the pushbutton actuator assemblies being disposed in a direction transverse to the movable part of the tuning element, the movable part being formed by a flat plate having formed therein a plurality of V-shaped notched cam edges each of which is associated with the respective pushbutton actuator assemblies and in each of which is located the upstanding pin of the control member so that movement of a particular pushbutton actuator assembly to its operative position causes the movable plate to be adjusted to a position corresponding to a particular frequency which is determined by the positioned control member; the pushbutton actuator assemblies being disposed in two sets, each set being disposed in a complementary manner on the opposite side of the movable plate from the other set such that each of the notched cam edges defines a recess formed in the movable plate and opening to the same side as the corresponding pushbutton actuator assembly, and each of the pushbutton actuator assemblies being arranged so that the upstanding pin on the control member carried thereby is located within the associated cam edge in the movable plate; said clutch trip means including a shift member which extends substantially parallel to the movable plate and mounted on the support so as to be movable in the lengthwise direction thereof, a plurality of cams on said shift member each associated with one of the pushbutton actuator assemblies, and a plurality of drive members each associated with one of the pushbutton actuator assemblies and each extending in the same direction as the slide of the corresponding pushbutton actuator assembly and slidably mounted on the support so that normally its one end is in bearing relationship with the rear surface of the pushbutton and its other end located to be engageable with the cam so that movement of a particular pushbutton actuator assembly causes the drive member to move axially thereof as the pushbutton is moved thereby driving the shift member to trip the clutch assembly.

2. A pushbutton tuner according to claim 1 in which the shift member is located rearwardly of the movable plate.

3. A pushbutton tuner according to claim 1 in which the shift member is substantially aligned with the plane of the movable plate.

4. A pushbutton tuner according to claim 1 in which the shift member is connected with one end of a pair of parallel links having their other end pivotally connected with the support.

5. A pushbutton tuner according to claim 1 in which the drive members are disposed on the opposite side of the movable plate from the respective pushbutton actuator assemblies.

6. A pushbutton tuner according to claim 1 in which the movable plate comprises at least two apertured plate members bonded together such that the recesses are formed by the apertures.

7. A pushbutton tuner according to claim 1 in which the support includes a base plate; and wherein the tuning element, the pushbutton actuator assemblies, and the shift member and the drive members of the clutch trip means are disposed below the base plate, and the manually rotatable actuator and the clutch assembly are disposed above the base plate.

8. A pushbutton tuner according to claim 7, further including a lever pivotally mounted on the base plate and having its one end operatively connected with the tuning element, and a pointer member operatively connected with the other end of the lever.

9. A pushbutton tuner according to claim 7, further including a tape player disposed above the base plate.

10. In a pushbutton tuner including a support; a tape player mounted on the support and including a housing into which a tape cartridge can be inserted; a tuning element mounted on the support to establish a tuning frequency and including a movable part which is movable to a position corresponding to a desired tuning frequency; a manually rotatable actuator assembly for selectively adjusting the tuning element to a position corresponding to the desired tuning frequency; a clutch assembly for normally operatively connecting the manually rotatable actuator assembly with the tuning element; a plurality of presettable pushbutton actuator assemblies each operable to selectively adjust the tuning element to a position corresponding to a particular tuning frequency that is different from the tuning frequency established by any of the remaining pushbuttons; and clutch trip means for releasing the connection between the manually rotatable actuator assembly and the tuning element in response to operation of any one of the pushbutton actuator assemblies; the improvement wherein the support includes a base plate; the tuning element and the pushbutton actuator assemblies being disposed below the base plate; the cartridge housing, the manually rotatable actuator assembly and the clutch assembly being disposed above the base plate; the pushbutton actuator assemblies being disposed opposite to the cartridge housing on the opposite sides of the base plate; and the manually rotatable actuator assembly and the clutch assembly being disposed laterally of the cartridge housing.

* * * * *